United States Patent
Chen et al.

(10) Patent No.: US 8,174,423 B2
(45) Date of Patent: May 8, 2012

(54) PIPELINED ANALOG-TO-DIGITAL CONVERTER AND SUB-CONVERTER STAGE

(75) Inventors: Cheng Chen, Shanghai (CN); Jiren Yuan, Shanghai (CN)

(73) Assignee: Emensa Technology Ltd. Co., Shanghai (CN)

( * ) Notice: Subject to any disclaimer, the term of this patent is extended or adjusted under 35 U.S.C. 154(b) by 41 days.

(21) Appl. No.: 12/889,136

(22) Filed: Sep. 23, 2010

(65) Prior Publication Data

US 2011/0285563 A1    Nov. 24, 2011

(30) Foreign Application Priority Data

May 18, 2010    (CN) .......................... 2010 1 0179395

(51) Int. Cl.
*H03M 1/38* (2006.01)
(52) U.S. Cl. ......... 341/161; 341/118; 341/162; 341/172
(58) Field of Classification Search .................. 341/118, 341/161, 172
See application file for complete search history.

(56) References Cited

U.S. PATENT DOCUMENTS

| | | | | |
|---|---|---|---|---|
| 6,097,326 | A * | 8/2000 | Opris et al. .................... | 341/161 |
| 6,184,809 | B1 | 2/2001 | Yu | |
| 6,232,898 | B1 | 5/2001 | Nagaraj | |
| 6,563,445 | B1 | 5/2003 | Sabouri | |
| 6,784,814 | B1 | 8/2004 | Nair et al. | |
| 6,967,610 | B1 * | 11/2005 | Sutardja et al. ................ | 341/161 |
| 7,233,276 | B1 | 6/2007 | Huang | |
| 7,307,572 | B2 * | 12/2007 | Garrity et al. ................. | 341/172 |
| 7,612,703 | B2 * | 11/2009 | Chen et al. ..................... | 341/172 |

* cited by examiner

*Primary Examiner* — Khai M Nguyen
(74) *Attorney, Agent, or Firm* — Hamre, Schumann, Mueller & Larson, P.C.

(57) ABSTRACT

The present invention introduces a sub-converter stage used in a pipelined analog-to-digital converter. The sub-converter stage comprises an amplifier with a gain A, a sub analog-to-digital converter with comparators and a digital unit, a first capacitor with capacitance C, a second capacitor with capacitance $C-\Delta C$, and customized reference signal $V_{refk}$, where $$\frac{\Delta C}{C} = \frac{4}{A+2}$$

and $$V_{refk} = V_{ref}\left(1 - \frac{\Delta C}{2C}\right).$$

If the gain A of the amplifier is adjustable, the sub-converter stage needs an error detector to detect the difference between the output of the amplifier and reference signal $V_{ref}$ and adjust the gain A of the amplifier. The present invention also introduces a pipelined analog-to-digital converter employing the sub-converter stage. In the pipelined analog-to-digital converter and the sub-converter stage presented by this invention, the error generated by the finite gain of amplifier and the error generated by the capacitance mismatch have the same size but opposite sign, ending that the two errors can compensate each other. As a result, the sub-converter stage achieves an error-free conversion and the two errors are calibrated.

17 Claims, 6 Drawing Sheets

100

200

PIPELINED ANALOG-TO-DIGITAL CONVERTER AND SUB-CONVERTER STAGE

BACKGROUND OF THE INVENTION

1. Field of the Invention

The present invention relates to an analog-to-digital converter, especially to a pipelined analog-to-digital converter with low-gain amplifier and calibration of capacitor mismatch and finite gain error of amplifier.

2. Related Art of the Invention

An analog-to-digital converter (ADC) is a device that converts an analog signal into a digital code, i.e. "digitizes" the analog signal. In the field of high speed ADCs, the fastest architecture reported to date is flash converter. However, an ADC based on a flash type will require a huge number of very accurate and fast comparators, which consume large chip area and power. Among various ADC architectures, the pipeline technique is one of the candidates to overcome those drawbacks of the flash-type ADC. Furthermore, the pipeline architecture has been proved that it could provide a better tradeoff among speed, accuracy, power, and chip area than other ADC architectures.

A block diagram of a conventional pipelined ADC with 1.5-bit/stage algorithm is shown in FIG. 1, where the resolution of ADC (100) is, for example, 10 bits. The ADC (100) consists of a sample-and-hold (101), sub-converter stages (102)-(109), a final flash stage (120), and a digital error correction circuit (130). The sample-and-hold (101) samples the input analog signal in sampling phase and then in holding phase generates an analog output which is quantified into a 1.5-bit digital code within the first stage (102). Both the resulting 1.5-bit code of stages (102)-(109) and 2-bit code of final stage (120) are sent to the digital block (130) for processing. The 1.5-bit code of each stage (102)-(109) is fed back to the stage itself to become an analog representation. The difference between the analog representation and the sampled analog input signal is multiplied by two to produce a residue signal which is sampled by the next stage. Each stage effectively converts only one bit of information and the extra half bit is used for redundancy to relieve the offset requirement of comparators. Digital error correction circuit (130) deals with the redundancy to generate a 10-bit digital result (each of the sub-converter stages (102)-(109) contributes 1 bit and the flash stage (120) contributes 2 bits). In the conventional pipelined ADC, the sample-and-hold (101) may be removed, and the resolution of flash stage (120) may be more than 2 bits, such as 3, 4, 5, 6, 7, 8, 9 bits.

The circuit diagrams of sub-converter stages (102)-(109) are identical, as illustrated in FIG. 2A (sampling phase) and FIG. 2B (holding phase). The examples in FIG. 2A (sampling phase) and FIG. 2B (holding phase) are single-ended but may be differential in practice and the same below. One sub-converter stage (200) comprises an amplifier (201), two capacitors C1 and C2, two comparators (210) and (211), and a digital unit (220). During sampling phase, as shown in FIG. 2A, the output and inverting input of amplifier (201) are connected together with the top plates of both C1 and C2. The non-inverting input of amplifier (201) is connected to a dc voltage (it's ground in the figure). The input analog signal $V_{in}$ is sampled parallel on the bottom plates of C1 and C2, and further fed to comparators (210) and (211) to compare with two reference voltages ($V_{ref}/4$ and $-V_{ref}/4$) respectively. The digital unit (220) receives the results of the two comparators and provides a digital output $D_i$ (−1, 0, or 1). During holding phase, as shown in FIG. 2B, the amplifier (201) is in amplification mode and its inverting input is still connected with the top plates of both C1 and C2. The bottom plate of C2 is connected with the output of amplifier (201). Depending on the value of $D_i$, the bottom plate of C1 is connected with different reference voltages ($-V_{ref}$, 0, or $V_{ref}$). As a result, the output of amplifier (201) is decided by the input analog signal $V_{in}$, $D_i$, capacitance ratio of C1 and C2, the gain A of amplifier (201), and reference voltage $V_{ref}$. In order to achieve an ideal multiplication of two of the input analog signal $V_{in}$ for the output $V_{out}$, C1 and C2 should be perfectly matched and the gain of amplifier (201) should be infinite.

FIG. 3 is a graph illustrating the ideal transfer characteristics of a 1.5-bit/stage conventional sub-converter stage. When $V_{in}$ equals to $V_{ref}/4$ and $-V_{ref}/4$, it corresponds to two thresholds or transition points.

In the above-mentioned pipelined architecture, the performance of ADC suffers from both the mismatch of capacitor and the finite amplifier gain. Many calibration approaches have been proposed to compensate the capacitor mismatch, such as U.S. Pat. No. 6,184,809 and U.S. Pat. No. 7,233,276. The finite amplifier gain error can be also calibrated, such as U.S. Pat. No. 6,784,814 and U.S. Pat. No. 6,563,445. Moreover, digital calibration procedure U.S. Pat. No. 6,232,898 corrects both the capacitor mismatch and finite amplifier gain. But these methods are generally difficult to implement, time consuming and/or with additional conversion process steps.

SUMMARY OF THE INVENTION

The present invention is directed to introduce a sub-converter stage used in pipelined ADC and with calibration of capacitor mismatch and finite gain error.

The present invention is also directed to introduce a pipelined ADC employing the aforementioned sub-converter stage.

In order to handle the above technical issues, the main idea of this invention is to make the error generated by the finite amplifier gain and the error generated by the capacitor mismatch in a sub-converter stage of a pipelined ADC have the same size but opposite sign, which means the two errors can compensate each other. As a result, the sub-converter stage achieves an error-free conversion and the two errors are calibrated. The two errors can be also calibrated in the pipelined ADC employing such sub-converter stage.

In order to handle the above technical issues, the present invention is directed to introduce a sub-converter stage used in pipelined ADC, which comprises an amplifier with a gain A, a sub analog-to-digital converter with comparators and a digital unit, a first capacitor with capacitance C, and a second capacitor with capacitance C−ΔC. The first capacitor is selectively connected between the analog input node and the amplifier input or between one of customized reference signals ($-V_{refk}$, 0, or $V_{refk}$) and the amplifier input. The second capacitor is selectively connected between the analog input node and the amplifier input or between the amplifier input and the amplifier output. Here, $$\frac{\Delta C}{C} = \frac{4}{A+2}$$

and $$V_{refk} = V_{ref}\left(1 - \frac{\Delta C}{2C}\right)$$

where ΔC is the capacitance mismatch and $V_{ref}$ is the nominal reference signal in conventional pipelined ADC. This sub-converter stage is called the error-free sub-converter stage below.

In one aspect, the aforementioned sub-converter stage includes sampling phase and holding phase. During a sampling phase, both the first capacitor and the second capacitor are connected between the analog input node and the amplifier input. During a holding phase, the first capacitor is connected between one of customized reference signals ($-V_{refk}$, 0, or $V_{refk}$) and the amplifier input, and the second capacitor is connected between the amplifier input and the amplifier output.

Optionally, the customized reference signal $V_{refk}$ is stored in a memory.

Another aspect of the present invention is to introduce another kind of sub-converter stage. The difference between this sub-converter stage and the aforementioned one is that the gain A of the amplifier is adjustable. Moreover, this sub-converter stage needs an error detector and a memory and has two operation modes: normal conversion mode and calibration mode.

During a sampling phase of the normal conversion mode, both the first capacitor and the second capacitor are connected between the analog input node and the amplifier input. During a holding phase of the normal conversion mode, the first capacitor is connected between one of customized reference signals ($-V_{refk}$, 0, or $V_{refk}$) and the amplifier input, and the second capacitor is connected between the amplifier input and the amplifier output.

During a sampling phase of the calibration mode, both the first capacitor and the second capacitor are connected between a reference signal $V_{ref}/2$ and the amplifier input. During a holding phase of the calibration mode, the first capacitor is connected between ground and the amplifier input, and the second capacitor is connected between the amplifier input and the amplifier output. The difference between the output of the amplifier and reference signal $V_{ref}$ is detected by the error detector. The output of the error detector is stored in the memory for adjusting the gain A of the amplifier to make the equation $$\frac{\Delta C}{C} = \frac{4}{A+2}$$

stand. This sub-converter stage is called the calibrating sub-converter stage below.

Optionally, the customized reference signal $V_{refk}$ may be generated as following steps:
(1) Charge both the first capacitor and the second capacitor to be $V_{ref}/2$;
(2) Transfer the charge on the second capacitor to the first capacitor by charge distribution, resulting in the voltage on the first capacitor to be $$V_{ref}\left(1 - \frac{\Delta C}{2C}\right)$$

which is stored as the customized reference voltage $V_{refk}$ in a memory.

In order to handle the above technical issues, the present invention is also directed to introduce a pipelined ADC which comprises cascaded N sub-converter stages and a flash stage, a control clock generator, and a digital error correction circuit. At least one of the N sub-converter stages is the aforementioned error-free sub-converter stage. N may be any integer number from 2 to 30.

Optionally, in the N sub-converter stages, all except for the error-free sub-converter stage(s) are conventional sub-converter stage.

Optionally, all of the N sub-converter stages are the error-free sub-converter stage.

Optionally, the aforementioned pipelined ADC comprises a sample-and-hold cascaded by the first sub-converter stage of the N sub-converter stages.

In order to handle the above technical issues, the present invention is directed to introduce another pipelined ADC which comprises cascaded N sub-converter stages and a flash stage, a control clock generator, and a digital error correction circuit. At least two of the N sub-converter stages are the aforementioned calibrating sub-converter stage. N may be any integer number from 2 to 30.

Optionally, only one of those calibrating sub-converter stages is in calibration mode at the same time and the others are in normal conversion mode. Those calibrating sub-converter stages are calibrated one by one periodically. The stage under calibration is removed from the pipeline and joins back to the pipeline under normal conversion mode.

Optionally, there is a switch unit between each of those calibrating sub-converter stages and next stage of it.

Optionally, the switch unit has a first input and a second input. The first input is connected with the output of the former sub-converter stage, and the second input is connected with the output of the sub-converter stage before the former one. When the former sub-converter stage is under calibration mode, the first input of the switch unit is disabled and the second input is valid. When the former sub-converter stage is under normal conversion mode, the first input of the switch unit is valid and the second input is disabled.

Optionally, among the N sub-converter stages, all except for the calibrating sub-converter stages are conventional sub-converter stage or the error-free sub-converter stage.

Optionally, all of the N sub-converter stages are the calibrating sub-converter stage.

Optionally, the aforementioned pipelined ADC comprises a sample-and-hold cascaded by the first sub-converter stage of the N sub-converter stages.

Optionally, those calibrating sub-converter stages share one error detector for saving chip area and power.

Compared with the conventional sub-converter stage used in pipelined ADC, the sub-converter stage in the present invention is introduced to make the error generated by the finite amplifier gain and the error generated by the capacitor mismatch have the same size but opposite sign, ending that the two errors can compensate each other. As a result, both of the two errors are calibrated in the sub-converter stage. In the sub-converter stage of pipelined ADC introduced by the present invention, one-stage low-gain architecture can be adopted for the amplifier and the choice of capacitor is insensitive to mismatch (only limited by kT/C noise), resulting that performance improvements are significant in conversion rate, power consumption, and chip area.

Compared with the conventional pipelined ADC, the pipelined ADC in the present invention uses the sub-converter stage introduced by the present invention, and hence the error generated by the finite amplifier gain and the error generated by the capacitor mismatch are calibrated as well. As a result, performance improvements are significant in conversion rate, power consumption, and chip area.

DETAILED DESCRIPTION OF THE INVENTION

In order to make it clearer of the aim, technique architecture and advantage in the present invention, the further details of the present invention are described with appended figures at the following.

Figure 4A:
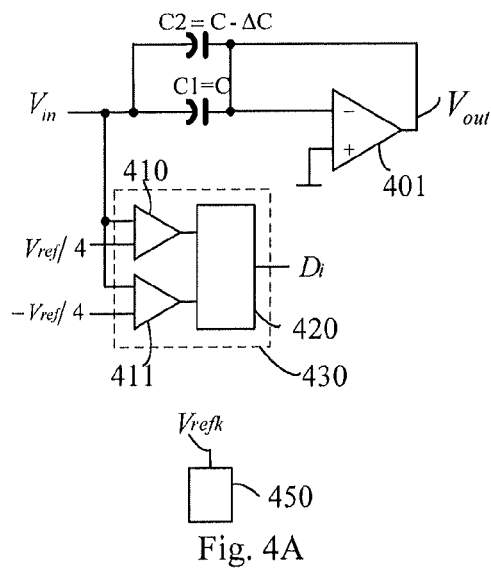
FIG. 4A is a circuit diagram illustrating the 1.5-bit error-free sub-converter stage of the present invention in the sampling phase.
Figure 4B:
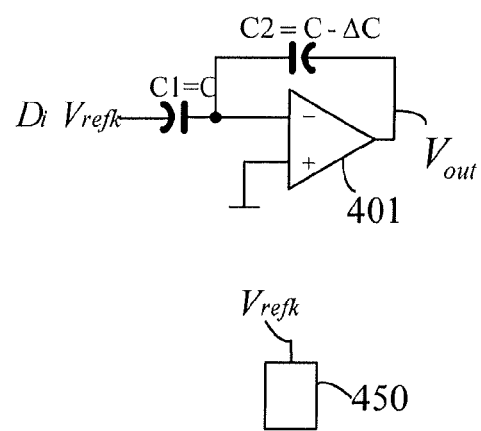
FIG. 4B is a circuit diagram illustrating the 1.5-bit error-free sub-converter stage of the present invention in the holding phase.

The sub-converter stage in the present invention comprises an amplifier (401), a sub analog-to-digital converter (430) with comparators (410)-(411) and a digital unit (420), a first capacitor C1, and a second capacitor C2. The first capacitor C1 is selectively connected between the analog input node (analog input signal $V_{in}$) and the amplifier (401) input (sampling phase as shown in FIG. 4A) or between one of customized reference signals ($-V_{refk}$, 0, or $V_{refk}$) and the amplifier (401) input (holding phase as shown in FIG. 4B). The second capacitor C2 is selectively connected between the analog input node and the amplifier (401) input (sampling phase as shown in FIG. 4A) or between the amplifier (401) input and the amplifier (401) output (holding phase as shown in FIG. 4B). The first capacitor C1(=C), the second capacitor C2(=C−ΔC), the gain A of the amplifier, and customized reference signal $V_{refk}$ satisfy expressions:

$$\frac{\Delta C}{C} = \frac{4}{A+2} \quad (1)$$

$$V_{refk} = \frac{V_{ref}}{2}\frac{(C1+C2)}{C1} = V_{ref}\left(1 - \frac{\Delta C}{2C}\right) \quad (2)$$

where ΔC is the capacitance mismatch and $V_{ref}$ is the nominal reference signal in conventional pipelined ADC.

During the sampling phase as shown in FIG. 4A, both the first capacitor C1 and the second capacitor C2 are connected between the analog input node and the amplifier (401) input. For details, the input analog signal is connected with the bottom plates of C1 and C2 during the sampling phase. The output and inverting input of amplifier (401) are connected together with the top plates of both C1 and C2. The two comparators (410)-(411) and digital unit (420) operate similarly as those in conventional sub-converter stages.

During the holding phase, as shown in FIG. 4B, the first capacitor C1 is connected between one of customized reference signals ($-V_{refk}$, 0, or $V_{refk}$) and the amplifier (401) input, and the second capacitor is connected between the amplifier (401) input and the amplifier (401) output. For details, the amplifier (401) is in amplification mode and its inverting input is still connected with the top plates of both C1 and C2. The bottom plate of C2 is connected with the output of amplifier (401). Depending on the value of $D_i$ (−1, 0 or 1), the bottom plate of C1 is connected with different reference signals $-V_{refk}$, 0, or $V_{refk}$. In this phase, the output $V_{out}$ of amplifier (401) is $$V_{out} = \frac{1}{1-\frac{\Delta C}{C}+\frac{2-\Delta C/C}{A}}\left(V_{in}\left(2-\frac{\Delta C}{C}\right) + D_i V_{refk}\right) \quad (3)$$

Here, $V_{in}$ is the effective input analog signal during the sampling phase and A is the dc gain of amplifier (401). ΔC is capacitance mismatch (error). If customized values of ΔC/C and A are selected to make the following expression stand $$2-\frac{\Delta C}{C} = 2\left(1-\frac{\Delta C}{C}+\frac{2-\Delta C/C}{A}\right) \quad (4)$$

which is the same with (1), the new expression of (3) is $$V_{out} = 2V_{in} + D_i\frac{V_{refk}}{1-\frac{\Delta C}{C}+\frac{2-\Delta C/C}{A}} = 2V_{in} + D_i V_{ref} \quad (5)$$

Here the input signal $V_{in}$ is multiplied by two accurately which is perfect for the 1.5-bit/stage pipelined ADC. This means that the finite amplifier gain error and capacitor mismatch error are compensated each other, resulting that the sub-converter stage is error free. This sub-converter stage is called the error-free sub-converter stage in the present invention.

As illustrated in FIG. 4A and FIG. 4B, the customized reference signal $V_{refk}$ may be stored in a memory (450) for use in the circuit.

In real environment, both the capacitance ratio ΔC/C and the gain A of amplifier (401) are inconstant due to the imperfection of manufacture process and temperature drifting. In order to make (1) always stand, the gain A of the amplifier may be tunable to adapt to the imperfection. As a result, the sub-converter stage needs an error detector (460) and a memory (470) and has two operation modes: normal conversion mode and calibration mode. This sub-converter stage is called the calibrating sub-converter stage in the present invention.

Figure 4C:
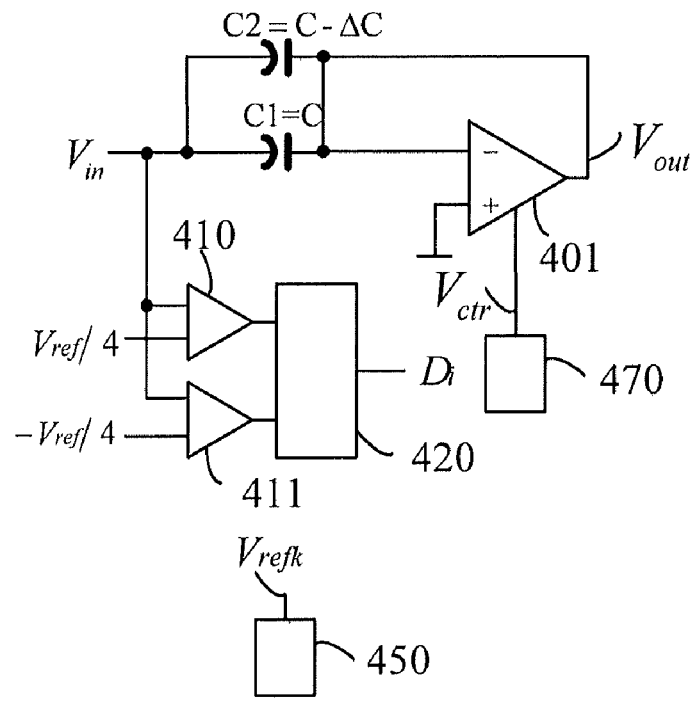
FIG. 4C is a circuit diagram illustrating the 1.5-bit calibrating sub-converter stage of the present invention in the sampling phase of the normal conversion mode.
Figure 4D:
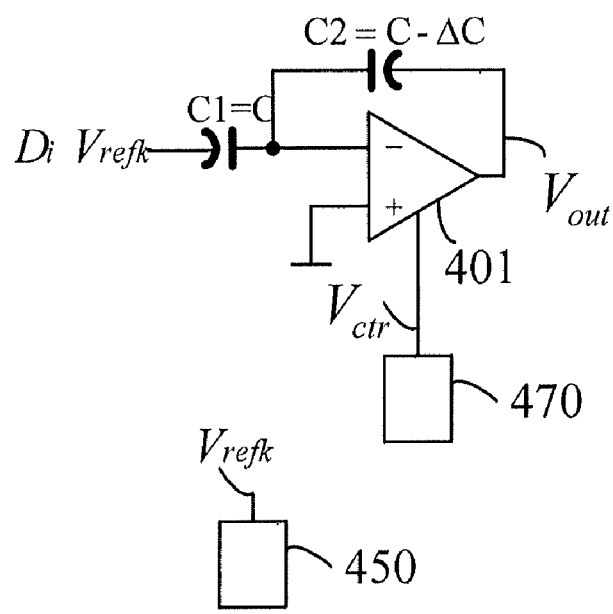
FIG. 4D is a circuit diagram illustrating the 1.5-bit calibrating sub-converter stage of the present invention in the holding phase of the normal conversion mode.

In the normal conversion mode, both the first capacitor C1 and the second capacitor C2 are connected between the analog input node and the amplifier (401) input during a sampling phase, as shown in FIG. 4C. During a holding phase as shown in FIG. 4D, the first capacitor C1 is connected between one of customized reference signals ($-V_{refk}$, 0, or $V_{refk}$) and the amplifier (401) input, and the second capacitor is connected between the amplifier (401) input and the amplifier (401) output.

Figure 4E:
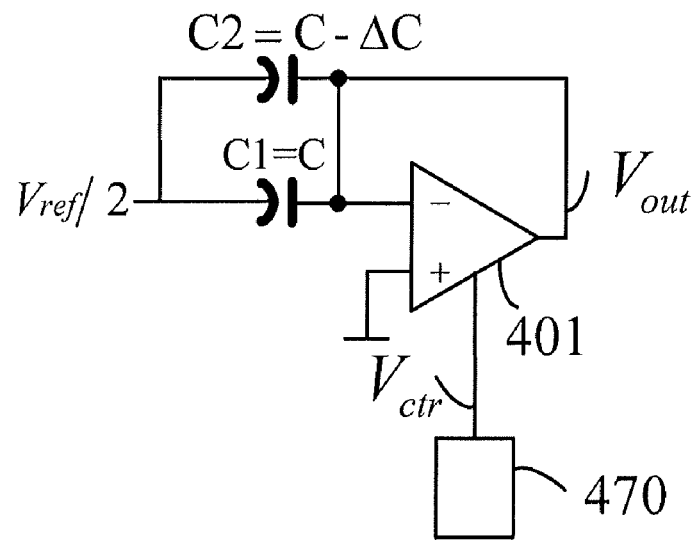
FIG. 4E is a circuit diagram illustrating the 1.5-bit calibrating sub-converter stage of the present invention in the sampling phase of the calibration mode.
Figure 4F:
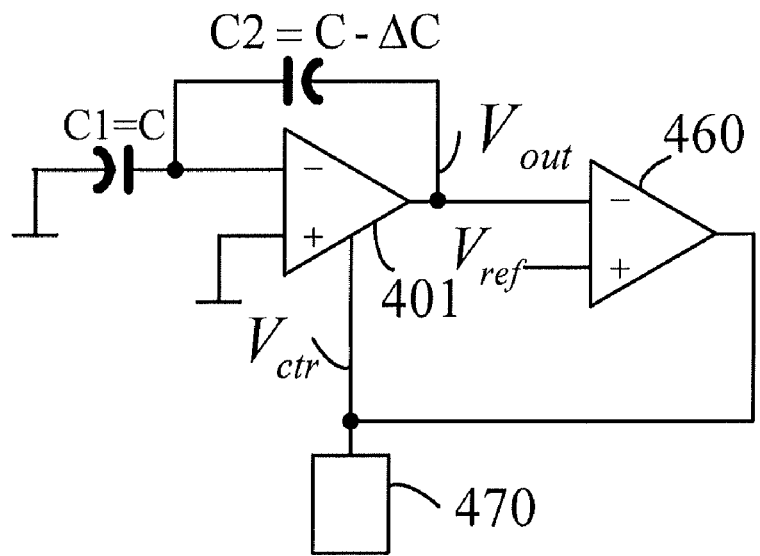
FIG. 4F is a circuit diagram illustrating the 1.5-bit calibrating sub-converter stage of the present invention in the holding phase of the normal calibration mode.

In the calibration mode, both the first capacitor C1 and the second capacitor C2 are connected between a reference signal $V_{ref}/2$ and the amplifier (401) input during a sampling phase, as shown in FIG. 4E. The reference signal $V_{ref}/2$ is sampled on C1 and C2. Here the amplifier (401), C1 and C2 operate similarly as those in FIG. 4A. During a holding phase as shown in FIG. 4F, the first capacitor C1 is connected between ground and the amplifier (401) input, and the second capacitor C2 is connected between the amplifier (401) input and the amplifier (401) output. For details, the bottom plate of C1 is connected with ground, and C2 turns to be a feedback capacitor. The output $V_{out}$ of amplifier (401) is expressed as $$V_{out} = \frac{V_{ref}\left(2 - \frac{\Delta C}{C}\right)}{2\left(1 - \frac{\Delta C}{C} + \frac{2 - \Delta C/C}{A}\right)} \quad (6)$$

The error detector (460) senses the difference between the output $V_{out}$ of amplifier (401) and reference signal $V_{ref}$. The output $V_{ctr}$ of the error detector (460) is stored in the memory (470) for adjusting the gain of the amplifier (401) to make the equation $$\frac{\Delta C}{C} = \frac{4}{A+2}$$

still stand even when the gain A of the amplifier (401) and/or the capacitance ratio $\Delta C/C$ drift in real environment. For details, the dc gain of error detector (460) is designed to be very high. Consisting of amplifier (401), error detector (460), capacitors C1 and C2, and memory (470), the closed loop settles with $V_{out}$ being equal to $V_{ref}$ which means the expression (1) stands. As a result, the dc gain A of amplifier (401) is customized perfectly, i.e. expression (1) stands, to make the finite amplifier gain error and capacitor mismatch compensated each other.

As a preferred embodiment, the sub-converter stages introduced in the present invention may be both single-ended and differential.

All of the customized reference signals $V_{refk}$ may be generated from $V_{ref}/2$ at a time during the power-on time or at the above calibration mode with additional phases (each sub-converter stage generates its customized reference signal every time during calibration mode), as following steps:
(1) Charge both the first capacitor C1 and the second capacitor C2 to be $V_{ref}/2$;
(2) Transfer the charge on C2 to C1 by charge distribution, resulting in the voltage on C1 to be $$\frac{V_{ref}}{2} \frac{(C1 + C2)}{C1}$$

which is $V_{refk}$.

The customized reference signal $V_{refk}$ may be stored in a memory (450).

Figure 5A:
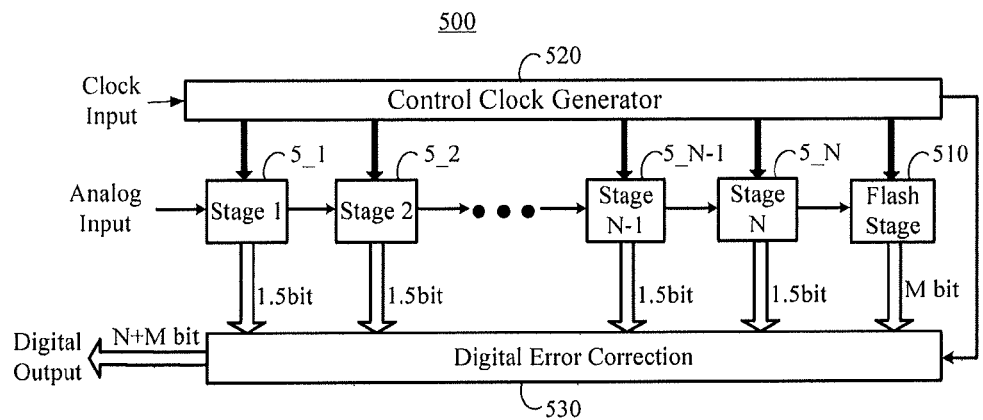
FIG. 5A is a schematic diagram of a 1.5-bit/stage pipelined ADC in accordance to the embodiment I of the present invention.

FIG. 5A shows a schematic diagram of a 1.5-bit/stage pipelined ADC in accordance to the embodiment I of the present invention. As illustrated in FIG. 5A, the pipelined ADC (500) comprises N sub-converter stages (5_1)-(5_N), a flash stage (510), a control clock generator (520), and a digital error correction circuit (530). At least one of the N sub-converter stages (5_1)-(5_N) is the aforementioned error-free sub-converter stage. In a preferred embodiment, all of the N sub-converter stages (5_1)-(5_N) may be the aforementioned error-free sub-converter stages. The analog input signal is converted by cascaded N sub-converter stages (5_1)-(5_N), and continues to be converted by M-bit flash stage (510). The outputs are sent to the digital error correction circuit (530). The output of each of N sub-converter stages (5_1)-(5_N) is 1.5-bit code that is sent to the digital error correction circuit (530). Each stage effectively converts one bit of information, and hence the output of the digital error correction circuit (530) is (N+M) bits. Connected with N sub-converter stages (5_1)-(5_N), the flash stage (510) and the digital error correction circuit (530), the control clock generator (520) receives the clock input and produces suitable timing phases to control the operation of every block. N may be any integer number from 2 to 30, and M may be any integer number from 2 to 20.

Figure 1:
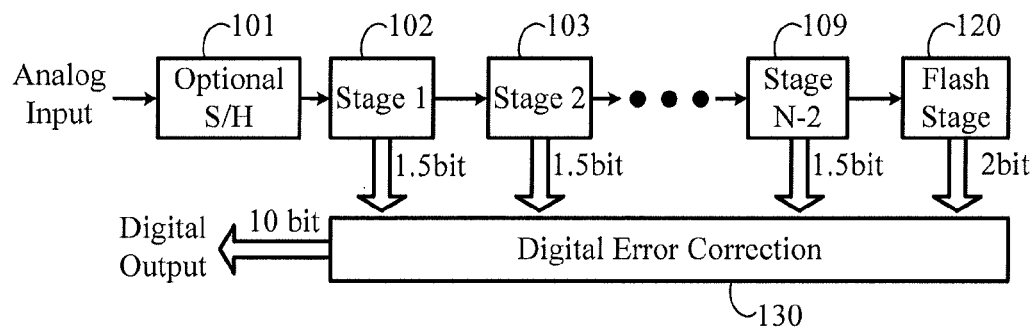
FIG. 1 is a schematic diagram of a conventional pipelined ADC with 1.5-bit/stage architecture.
Figure 2A:
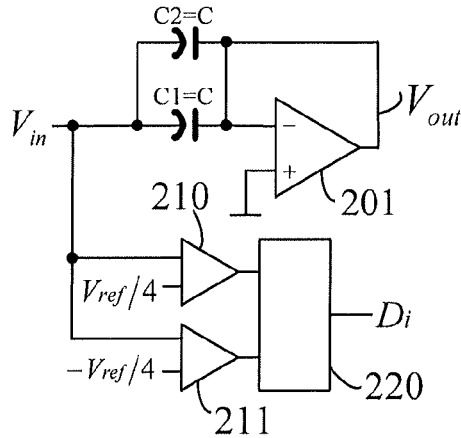
FIG. 2A is a circuit diagram of a conventional 1.5-bit sub-converter stage in the sampling phase.
Figure 2B:
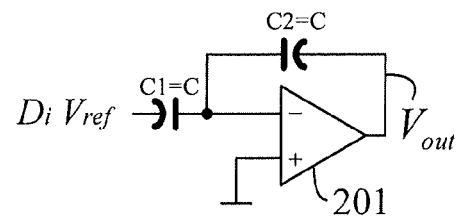
FIG. 2B is a circuit diagram of a conventional 1.5-bit sub-converter stage in the holding phase.
Figure 3:
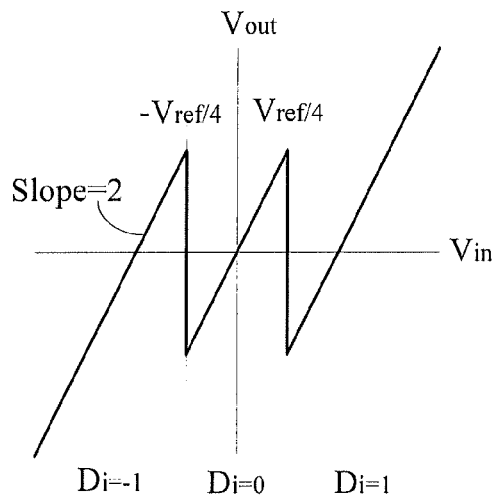
FIG. 3 is the quantization graph of input analog voltage in a conventional 1.5-bit sub-converter stage.
Figure 5B:
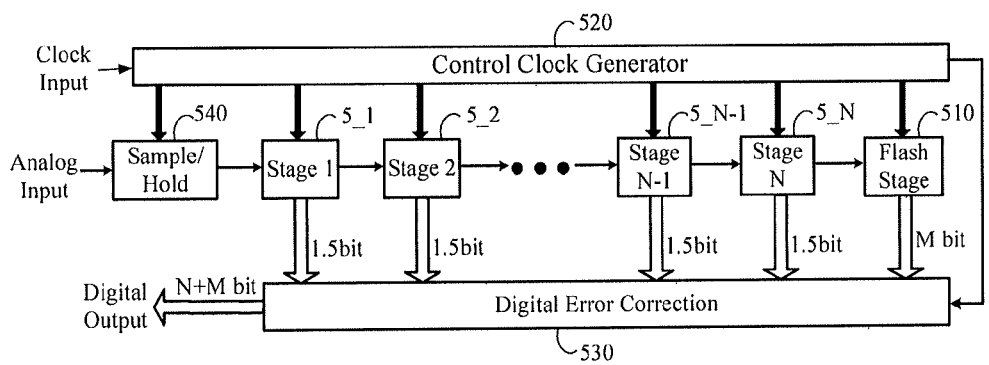
FIG. 5B is a schematic diagram of a 1.5-bit/stage pipelined ADC in accordance to the embodiment II of the present invention.

FIG. 5B shows a preferred embodiment (embodiment II) in which a sample-and-hold (540) is added before the first sub-converter stage (5_1). The sample-and-hold (540) is the same as the sample-and-hold (101) in FIG. 1. It samples the input analog signal and then in holding phase generates an output of the sampled signal. The operation of the sample-and-hold (540) is controlled as well by the timing phases produced from the control clock generator (520).

In the N sub-converter stages (5_1)-(5_N), all except for the error-free sub-converter stage(s) may be conventional sub-converter stage in which the resolution are (T+0.5) bits and T is any integer number from 1 to 30. Only 1.5-bit/stage conventional sub-converter stage is shown in FIG. 5A and FIG. 5B as example.

In the 1.5-bit/stage pipelined ADC introduced by the present invention, at least two of the N sub-converter stages (5_1)-(5_N) are the aforementioned calibrating sub-converter stage which has two operation modes: normal conversion mode and calibration mode. The calibrating sub-converter stage is removed from the pipeline under calibration mode, meaning that it is disconnected with last and next units. Here, it needs to be noted that the last unit is analog input node or sample-and-hold circuit if the calibrating sub-converter stage is the first sub-converter stage. The calibrating sub-converter stage is connected with last and next units under normal conversion mode. Those calibrating sub-converter stages are controlled by clock timing phases to be in calibration mode by turns, guaranteeing that only one of those calibrating sub-converter stages is in calibration mode at the same time and the others are in normal conversion mode which means a quasi real-time calibration periodically without interrupting the normal conversion. In the N sub-converter stages (5_1)-(5_N), all except for the calibrating sub-converter stages may be the aforementioned error-free sub-converter stage or conventional sub-converter stage in which the resolution are (T+0.5) bits and T is any integer number from 1 to 30.

Those calibrating sub-converter stages have to be removed from the pipeline under calibration and joins back to the pipeline under normal conversion mode. Furthermore, they have to be in calibration mode by turns as well. In order to realize such an operation, there may be a switch unit (550) between each of those calibrating sub-converter stages and next stage of it (sub-converter stage or flash stage). The switch unit (550) has two inputs and one output, where the first input is connected with the output of the former calibrating sub-converter stage and the second input is connected with the output of the unit before the former one. The output of the switch unit (550) is connected with the input of the next unit. One of the inputs of the switch unit (550) is selected to be valid under the control of clock timing phases. When the calibrating sub-converter stage before the switch unit (550) is under calibration mode, the first input is disabled and the second input is valid. When the calibrating sub-converter stage before the switch unit (550) is under normal conversion mode, the first input is valid and the second input is disabled.

Figure 5D:
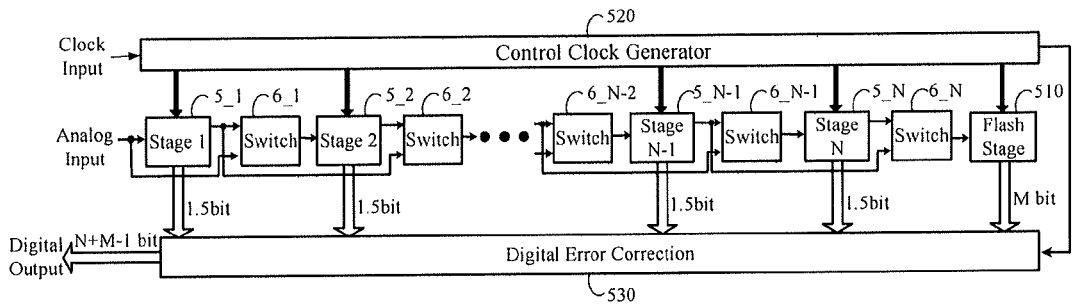
FIG. 5D is a schematic diagram of a 1.5-bit/stage pipelined ADC in accordance to the embodiment IV of the present invention.
Figure 5C:
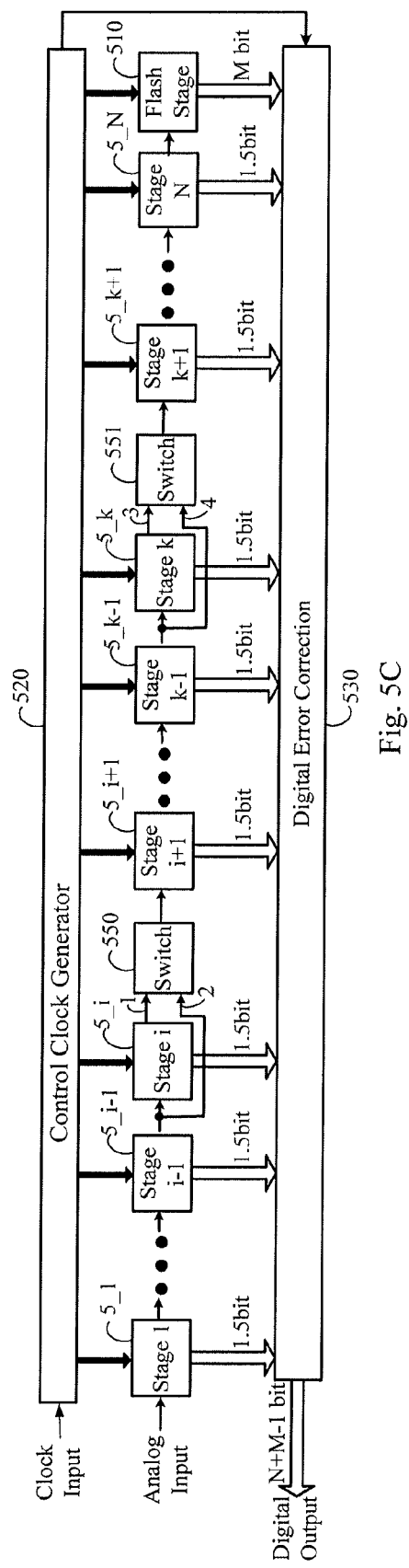
FIG. 5C is a schematic diagram of a 1.5-bit/stage pipelined ADC in accordance to the embodiment III of the present invention.

FIG. 5C shows a schematic diagram of a 1.5-bit/stage pipelined ADC in accordance to the embodiment III of the present invention. As illustrated in FIG. 5C, two of the N sub-converter stages (5_1)-(5_N) in the pipelined ADC are the aforementioned calibrating sub-converter stage and they are stage i and stage k ($1 \leq i < k \leq N$) respectively. A switch unit (550) is connected between sub-converter stage i and sub-converter stage i+1. The switch unit (550) has two inputs, i.e. input 1 and input 2. The input 1 is connected with the output of the sub-converter stage i and the input 2 is connected with the output of the sub-converter stage i−1. If i=1, the unit 0 is analog input node or sample-and-hold circuit. A switch unit (551) is connected between sub-converter stage k and sub-converter stage k+1. The switch unit (551) has two inputs, i.e. input 3 and input 4. The input 3 is connected with the output of the sub-converter stage k and the input 4 is connected with the output of the sub-converter stage k−1. If k=N, the unit N+1 is the flash stage (510). Both the operation of the calibrating sub-converter stage i and k and the input validation of switch unit are controlled by timing phases produced from the clock generator (520). When the calibrating sub-converter stage i is under calibration mode, the input 1 of the switch unit (550) is disabled and the input 2 is valid. When the calibrating sub-converter stage k is under normal conversion mode, the input 3 of the switch unit (551) is valid and the input 4 is disabled. On the contrary, when the calibrating sub-converter stage i is under normal conversion mode, the input 1 of the switch unit (550) is valid and the input 2 is disabled. When the calibrating sub-converter stage k is under calibration mode, the input 3 of the switch unit (551) is disabled and the input 4 is valid. The calibrating sub-converter stage i and k are calibrated by turns periodically. Note that all except for the calibrating sub-converter stages i and k in the N sub-converter stages (5_1)-(5_N) may be the aforementioned error-free sub-converter stage or conventional sub-converter stage in which the resolution are (T+0.5) bits and T is any integer number from 1 to 30. Only 1.5-bit/stage conventional sub-converter stage is shown in FIG. 5C as example.

FIG. 5D shows a preferred embodiment (embodiment IV) in which all of the N sub-converter stages (5_1)-(5_N) in the 1.5-bit/stage pipelined ADC are the aforementioned calibrating sub-converter stage. Each of the N sub-converter stages (5_1)-(5_N) is cascaded by a switch unit (6_1)-(6_N) and is calibrated one bye one in turns under the control of timing phases.

As a preferred embodiment, a sample-and-hold (540) is added before the first sub-converter stage (5_1) of the 1.5-bit/stage pipelined ADC introduced in the present invention, including embodiment III and IV. The sample-and-hold (540) is the same as the sample-and-hold (101) in FIG. 1. It samples the input analog signal and then in holding phase generates an output of the sampled signal. The operation of the sample-and-hold (540) is controlled as well by the timing phases produced from the control clock generator (520).

As a preferred embodiment, the calibrating sub-converter stages with two operation modes of the 1.5-bit/stage pipelined ADC introduced in the present invention may share one error detector for saving chip area and power. Generally, N may be any integer number from 2 to 30, and M may be any integer number from 2 to 20.

A lot of embodiments with numerous variations may be made without departing from the spirit or scope of the present invention. It is to be understood that the present invention is not limited to the embodiments introduced in the description except for those as defined in the appended claims.

What is claimed is:

1. A sub-converter stage for a pipelined analog-to-digital converter, the sub-converter stage comprising: an amplifier with a dc gain A, a sub analog-to-digital converter with comparators and a digital unit, a first capacitor with capacitance C, a second capacitor with capacitance C−ΔC, and
wherein said first capacitor is selectively connected between an analog input node and input of said amplifier or between one of customized reference signals (−V$_{refk}$, 0, or V$_{refk}$) and the input of said amplifier; said second capacitor is selectively connected between the analog input node and the input of said amplifier or between the input of said amplifier and output of said amplifier, and wherein $$\frac{\Delta C}{C} = \frac{4}{A+2}$$

and $$V_{refk} = V_{ref}\left(1 - \frac{\Delta C}{2C}\right),$$

in which ΔC is the capacitance mismatch and V$_{ref}$ is the nominal reference signal in conventional pipelined analog-to-digital converter.

2. The sub-converter stage of claim 1, wherein
during a sampling phase, both said first capacitor and said second capacitor are connected between the analog input node and the input of said amplifier, and during a holding phase, said first capacitor is connected between one of customized reference signals (−V$_{refk}$, 0, or V$_{refk}$) and the input of said amplifier and said second capacitor is connected between the input of said amplifier and the output of said amplifier.

3. The sub-converter stage of claim 1 wherein the customized reference signal V$_{refk}$ is stored in a memory.

4. The sub-converter stage of claim 1 wherein the gain of said amplifier is adjustable, and further comprising an error detector and a memory, and said sub-converter stage has two operation modes: normal conversion mode and calibration mode, and
during a sampling phase of the normal conversion mode, both said first capacitor and said second capacitor are connected between the analog input node and the input of said amplifier, and during a holding phase of the normal conversion mode, said first capacitor is connected between one of customized reference signals ($-V_{refk}$, 0, or $V_{refk}$) and the input of said amplifier and said second capacitor is connected between the input of said amplifier and the output of said amplifier, and during a sampling phase of the calibration mode, both said first capacitor and said second capacitor are connected between a reference signal $V_{ref}/2$ and the input of said amplifier, and during a holding phase of the calibration mode, said first capacitor is connected between ground and the input of said amplifier and said second capacitor is connected between the input of said amplifier and the output of said amplifier and the difference between the output of said amplifier and reference signal $V_{ref}$ is detected by said error detector whose output is stored in said memory for adjusting the gain of said amplifier to make said equation $$\frac{\Delta C}{C} = \frac{4}{A+2}$$

still stand.

5. The sub-converter stage of claim 1 wherein said customized reference signal $V_{refk}$ is generated by following steps:
   (1) charging both said first capacitor and said second capacitor to be $V_{refk}/2$;
   (2) transferring the charge on said second capacitor to said first capacitor by charge distribution, resulting in the voltage on said first capacitor to be $$V_{ref}\left(1 - \frac{\Delta C}{2C}\right)$$

which is stored in a memory as said customized reference signal $V_{refk}$.

6. A pipelined analog-to-digital converter, comprising:
   cascaded N sub-converter stages,
   a flash stage, a control clock generator and
   a digital error correction circuit,
   wherein at least one of said N sub-converter stages is a sub-converter stage for a pipelined analog-to-digital converter, the sub-converter stage comprising: an amplifier with a dc gain A, a sub analog-to-digital converter with comparators and a digital unit, a first capacitor with capacitance C, a second capacitor with capacitance $C-\Delta C$,
   wherein said first capacitor is selectively connected between an analog input node and input of said amplifier or between one of customized reference signals ($-V_{refk}$, 0, or $V_{refk}$) and the input of said amplifier, said second capacitor is selectively connected between the analog input node and the input of said amplifier or between the input of said amplifier and output of said amplifier, and wherein $$\frac{\Delta C}{C} = \frac{4}{A+2}$$
and
$$V_{refk} = V_{ref}\left(1 - \frac{\Delta C}{2C}\right),$$

in which $\Delta C$ is the capacitance mismatch and $V_{ref}$ is the nominal reference signal in conventional pipelined analog-to-digital converter, and N is any integer number from 2 to 30.

7. The pipelined analog-to-digital converter of claim 6 wherein all except for said sub-converter stage(s) of claim 6 are conventional sub-converter stage among said N sub-converter stages.

8. The pipelined analog-to-digital converter of claim 6 wherein all of said N sub-converter stages are said sub-converter stage.

9. The pipelined analog-to-digital converter of claim 6, further comprising a sample-and-hold cascaded by the first sub-converter stage of said N sub-converter stages.

10. A pipelined analog-to-digital converter, comprising:
    cascaded N sub-converter stages
    a flash stage,
    a control clock generator, and
    a digital error correction circuit,
    wherein at least two of said N sub-converter stages are a sub-converter stage for a pipelined analog-to-digital converter, the sub-converter stage comprising: an amplifier with a dc gain A, a sub analog-to-digital converter with comparators and a digital unit, a first capacitor with capacitance C, a second capacitor with capacitance $C-\Delta C$,
    wherein said first capacitor is selectively connected between an analog input node and input of said amplifier or between one of customized reference signals ($-V_{refk}$, 0, or $V_{refk}$) and the of said am said second is selectively connected between the analog input node and the input of said amplifier or between the input of said amplifier and output of said amplifier,
    wherein $$\frac{\Delta C}{C} = \frac{4}{A+2}$$
and
$$V_{refk} = V_{ref}\left(1 - \frac{\Delta C}{2C}\right),$$

in which $\Delta C$ is the capacitance mismatch and $V_{ref}$ is the nominal reference signal in conventional pipelined analog-to-digital converter, and wherein the gain of said amplifier is adjustable, and further comprising an error detector and a memory, and said sub-converter stage has two operation modes: normal conversion mode and calibration mode, and during a sampling phase of the normal conversion mode, both said first capacitor and said second capacitor are connected between the analog input node and the input of said amplifier, and during a holding phase of the normal conversion mode, said first capacitor is connected between one of customized reference signals ($-V_{refk}$, 0, or $V_{refk}$) and the input of said amplifier and said second capacitor is connected between the input of said amplifier and the output of said amplifier, and during a sampling phase of the calibration mode, both said first capacitor and said second capacitor are connected between a reference signal $V_{ref}/2$ and the input of said amplifier, and during a holding phase of the calibration mode, said first capacitor is connected between ground and the input of said amplifier and said second capacitor is connected between the input of said amplifier and the output of said amplifier and the difference between the output of said amplifier and reference signal $V_{ref}$ is detected by said error detector whose output is stored in said memory for adjusting the gain of said amplifier to make said equation $$\frac{\Delta C}{C} = \frac{4}{A+2}$$

still stand, in which the N is any integer number from 2 to 30.

11. The pipelined analog-to-digital converter of claim 10 wherein only one of said at least two of said N sub-converter stages is in calibration mode at the same time that the others are in normal conversion mode; said at least two of said N sub-converter stages are calibrated by turns; said at least two of said N sub-converter stages are removed from the pipeline during calibration and join back to the pipeline during normal conversion mode.

12. The pipelined analog-to-digital converter of claim 11 wherein there is a switch unit between each of said at least two of said N sub-converter stages and next stage of it.

13. The pipelined analog-to-digital converter of claim 12 wherein said switch unit has a first input and a second input; said first input is connected with the output of former sub-converter stage and said second input is connected with the output of the sub-converter stage before said former one, and
when said former sub-converter stage is under calibration mode, said first input of said switch unit is disabled and said second input is valid;
when said former sub-converter stage is under normal conversion mode, said first input of said switch unit is valid and said second input is disabled.

14. The pipelined analog-to-digital converter of claim 10, wherein, among said N sub-converter stages, all except for said sub-converter stages are conventional sub-converter stage or a sub-converter stage for a pipelined analog-to-digital converter, the sub-converter stage comprising: an amplifier with a dc gain A, a sub analog-to-digital converter with comparators and a digital unit, a first capacitor with capacitance C, a second capacitor with capacitance C−ΔC, and wherein said first capacitor is selectively connected between an analog input node and input of said amplifier or between one of customized reference signals (−$V_{refk}$, 0, or $V_{refk}$) and the input of said amplifier; said second capacitor is selectively connected between the analog input node and the input of said amplifier or between the input of said amplifier and output of said amplifier, and wherein $$\frac{\Delta C}{C} = \frac{4}{A+2}$$

and $$V_{refk} = V_{ref}\left(1 - \frac{\Delta C}{2C}\right),$$

in which ΔC is the capacitance mismatch and $V_{ref}$ is the nominal reference signal in conventional pipelined analog-to-digital converter.

15. The pipelined analog-to-digital converter of claim 10 wherein all of said N sub-converter stages are said sub-converter stage.

16. The pipelined analog-to-digital converter of claim 10, further comprising a sample-and-hold cascaded by the first sub-converter stage of said N sub-converter stages.

17. The pipelined analog-to-digital converter of claim 10 wherein said at least two of said N sub-converter stages share one error detector for saving chip area and power.

* * * * *